(12) United States Patent
Song et al.

(10) Patent No.: US 7,466,026 B2
(45) Date of Patent: Dec. 16, 2008

(54) PASSIVATION LAYER ASSEMBLY ON A SUBSTRATE AND DISPLAY SUBSTRATE HAVING THE SAME

(75) Inventors: In-Ho Song, Chungcheongnam-do (KR); Kwan-young Cho, Chungcheongnam-do (KR); Ho Lee, Chungcheongnam-do (KR); Je-Min Lee, Kwangju (KR)

(73) Assignee: Samsung Electronics, Co., Ltd., Kyungki-do (KR)

( * ) Notice: Subject to any disclaimer, the term of this patent is extended or adjusted under 35 U.S.C. 154(b) by 268 days.

(21) Appl. No.: 11/239,716

(22) Filed: Sep. 29, 2005

(65) Prior Publication Data

US 2006/0076653 A1   Apr. 13, 2006

(30) Foreign Application Priority Data

Oct. 8, 2004   (KR) ............... 10-2004-0080543

(51) Int. Cl.
*H01L 23/48*   (2006.01)
*H01L 23/52*   (2006.01)

(52) U.S. Cl. ............... 257/760; 257/59; 257/774; 257/E29.117

(58) Field of Classification Search ............. 438/701, 438/689, 738; 257/635, 758, 760, 773, 774, 257/E29.117, E29.273, 59, 72; 349/52; 977/952
See application file for complete search history.

(56) References Cited

U.S. PATENT DOCUMENTS

| 6,180,997 B1 * | 1/2001 | Lin .................... 257/637 |
| 6,265,247 B1 * | 7/2001 | Nakanishi et al. ........... 438/149 |
| 6,900,853 B2 * | 5/2005 | Watanabe et al. ............. 349/43 |
| 2001/0030717 A1 * | 10/2001 | Kaneko et al. ................ 349/43 |
| 2002/0140895 A1 * | 10/2002 | Kimura et al. .............. 349/187 |

* cited by examiner

*Primary Examiner*—Thanhha Pham
(74) *Attorney, Agent, or Firm*—Macpherson Kwok Chen & Heid LLP; Mark A. Pellegrini

(57) ABSTRACT

A passivation layer assembly and a display substrate having the same are presented. The passivation layer assembly is positioned on a substrate having a thin film assembly and protects the thin film assembly. The thin film assembly includes a first passivation layer and a second passivation layer. The first passivation layer contacts the thin film assembly. The first passivation layer has a first etching rate with respect to an etching agent. The second passivation layer is on the first passivation layer. The second passivation layer has a second etching rate that is higher than the first etching rate with respect to the etching agent. The passivation assembly decrease the malfunction rate of the display device.

10 Claims, 5 Drawing Sheets

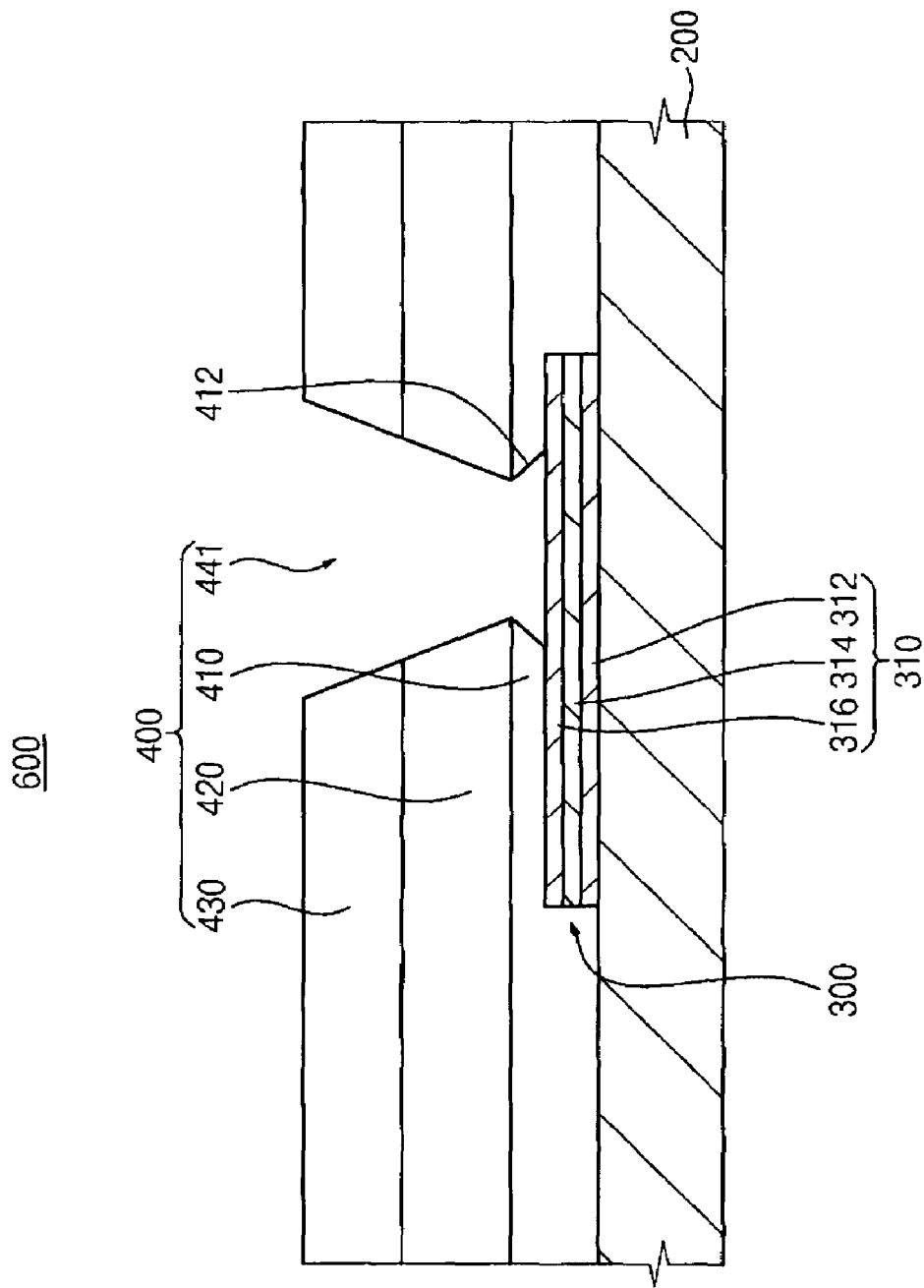

PASSIVATION LAYER ASSEMBLY ON A SUBSTRATE AND DISPLAY SUBSTRATE HAVING THE SAME

CROSS-REFERENCE OF RELATED APPLICATION

The present application claims priority from Korean Patent Application No. 2004-80543 filed on Oct. 8, 2004, the content of which is incorporated herein by reference in its entirety.

BACKGROUND OF THE INVENTION

1. Field of the Invention

The present invention relates to a passivation layer assembly on a substrate and a display substrate having the passivation layer assembly. More particularly, the present invention relates to a passivation layer assembly on a substrate that is capable of decreasing the malfunction rate of a display device, and a display substrate having the passivation layer assembly.

2. Description of the Related Art

An electronic device such as a cellular phone, a digital camera, a notebook computer, a monitor, etc., includes a display device that displays an image based on an image signal from a separate component that is connected to the display device. There are many types of display devices, some examples of which are a cathode ray tube (CRT) device, a liquid crystal display (LCD) device, a plasma display panel (PDP) device, a field emission display (FED) device, an organic light emitting display (OLED) device, etc.

Of the numerous types of display devices, the LCD device has advantageous characteristics such as its compactness, thinness, lightness, low power consumption, low driving voltage, etc. An LCD device displays images using electrical and optical characteristics of liquid crystals.

The LCD device includes a display panel that displays images using the light transmittance property of the liquid crystals. The display panel includes a first substrate, a second substrate, and a liquid crystal layer between the first and second substrates. The first substrate includes a plurality of thin film transistors (TFTs). The second substrate includes a color filter. The liquid crystal layer is interposed between the first and second substrates.

The first substrate further includes an insulating layer on the TFTs and a pixel electrode that is electrically connected to each of the TFTs. The insulating layer has a contact hole through which each of the TFTs is electrically connected to the pixel electrode. The insulating layer is partially etched using an etchant, to form the contact hole.

When a vertical profile of the contact hole is irregular, the TFT is disconnected from the pixel electrode to generate a malfunction of the LCD device.

SUMMARY OF THE INVENTION

The present invention provides a passivation layer assembly on a substrate, which is capable of decreasing a malfunction of a display device.

The present invention also provides a display substrate having the above-mentioned passivation layer assembly.

A passivation layer assembly on a substrate having a thin film assembly to protect the thin film assembly in accordance with an exemplary embodiment of the present invention includes a first passivation layer and a second passivation layer. The first passivation layer makes contact with the thin film assembly. The first passivation layer has a first etching rate with respect to an etching agent. The second passivation layer is on the first passivation layer. The second passivation layer has a second etching rate that is higher than the first etching rate with respect to the etching agent.

A display substrate in accordance with an exemplary embodiment of the present invention includes a substrate, a thin film transistor and a passivation layer assembly. The thin film transistor is on the substrate. The thin film transistor includes a source electrode, a drain electrode and a gate electrode. The passivation layer assembly has a contact hole through which the drain electrode is partially exposed. The passivation layer assembly includes a first passivation layer and a second passivation layer. The first passivation layer makes contact with the thin film transistor. The first passivation layer has a first etching rate with respect to an etching agent. The second passivation layer is on the first passivation layer. The second passivation layer has a second etching rate that is higher than the first etching rate with respect to the etching agent.

According to the present invention, the second passivation layer has higher etching rate than the first passivation layer so that the contact hole has the regular cross-section. Therefore, the TFT is securely connected to the pixel electrode to prevent a malfunction of the LCD device.

BRIEF DESCRIPTION OF THE DRAWINGS

The above and other advantages of the present invention will become more apparent by describing in detail exemplary embodiments thereof with reference to the accompanying drawings, in which:

FIG. 7 is a cross-sectional view showing a display substrate in accordance with another exemplary embodiment of the present invention.

DESCRIPTION OF THE EMBODIMENTS

It should be understood that the exemplary embodiments of the present invention described below may be varied or modified in many different ways without departing from the inventive principles disclosed herein, and the scope of the present invention is therefore not limited to these particular following embodiments. Rather, these embodiments are provided so that this disclosure will be thorough and complete, and will fully convey the concept of the invention to those skilled in the art by way of example and not of limitation.

Hereinafter, the present invention will be described in detail with reference to the accompanying drawings.

Figure 1:
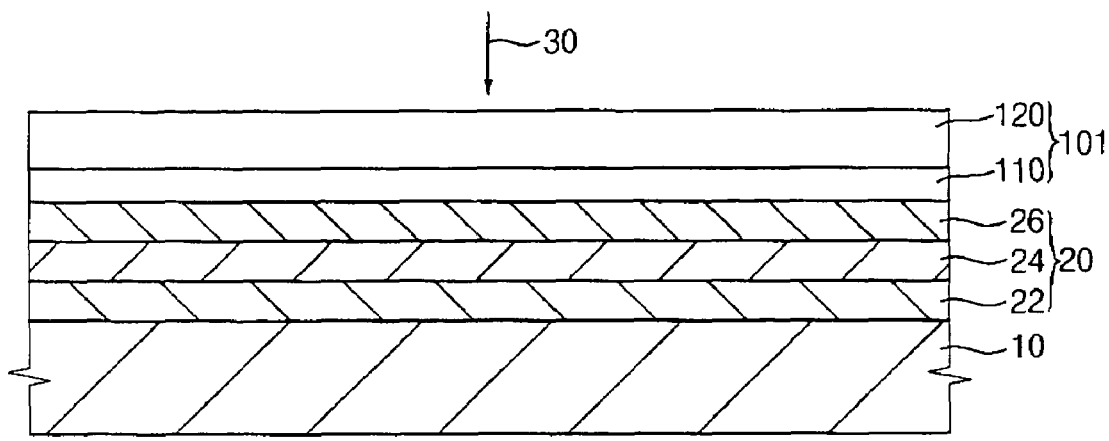
FIG. 1 is a cross-sectional view showing a passivation layer assembly on a substrate in accordance with an exemplary embodiment of the present invention.
Figure 2:
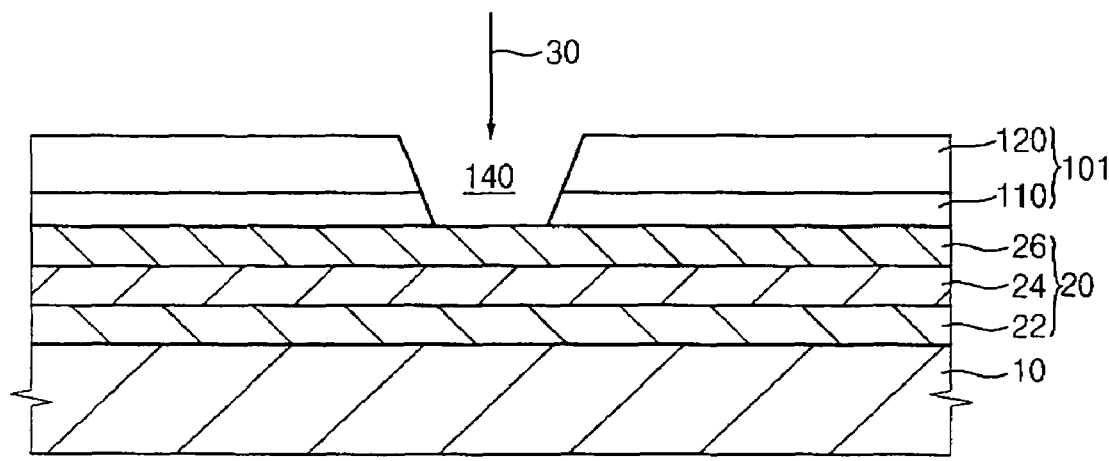
FIG. 2 is a cross-sectional view showing a contact hole formed in the passivation layer assembly shown in FIG. 1.

FIG. 1 is a cross-sectional view showing a passivation layer assembly on a substrate in accordance with an exemplary embodiment of the present invention. FIG. 2 is a cross-sectional view showing a contact hole formed in the passivation layer assembly shown in FIG. 1.

Referring to FIGS. 1 and 2, the passivation layer assembly 101 is formed on a thin film assembly 20 to protect the thin film assembly 20. The thin film assembly 20 is formed on a substrate 10.

The thin film assembly 20 includes a first thin film 22, a second thin film 24, and a third thin film 26.

The first, second and third thin films 22, 24 and 26 may contain a metal. In this exemplary embodiment, the first, second and third thin films 22, 24 and 26 contain molybdenum (Mo), aluminum (Al) and molybdenum (Mo), respectively. The first, second and third thin films 22, 24 and 26 may contain chromium (Cr), aluminum (Al) and chromium (Cr), respectively.

The passivation layer assembly 101 includes a first passivation layer 110 and a second passivation layer 120. In this exemplary embodiment, the passivation layer assembly 101 contains amorphous silicon hydride (a-SiNx:H, a-SiOx:H, etc.). In FIGS. 1 and 2, the first and second passivation layers 110 and 120 include a-SiNx:H having different nitrogen compositions. For example, a nitrogen composition of the first passivation layer 110 is smaller than a nitrogen composition of the second passivation layer 120. Alternatively, the nitrogen composition of the first passivation layer 110 may be greater than the nitrogen composition of the third passivation layer 130. The first and second passivation layers 110 and 120 may also include a-SiOx:H having different oxygen compositions.

The first passivation layer 110 is on the thin film assembly 20, and makes contact with the thin film assembly 20 to protect the thin film assembly 20. In this exemplary embodiment, the first passivation layer 110 has a first etching rate with respect to an etching agent 30.

The second passivation layer 120 is on the first passivation layer 110 to protect the thin film assembly 20. In this exemplary embodiment, the second passivation layer 120 has a second etching rate that is higher than the first etching rate with respect to the etching agent 30.

The passivation layer assembly 101 is etched by the etching agent 30 to form a contact hole 140 through which the thin film assembly 101 is partially exposed. The second etching rate of the second passivation layer 120 is higher than the first etching rate of the first passivation layer 110 so that the average diameter of the contact hole is larger in the second passivation layer 120 than in the first passivation layer 110. Therefore, the contact hole 140 has a regular cross-section such as a trapezoidal cross-section. The upper portion of the contact hole 140 has a greater width than the lower portion of the contact hole 140. As used herein, the "upper portion" is farther away from the substrate than the "lower portion."

According to this exemplary embodiment, the second passivation layer 120 has a higher etching rate than the first passivation layer 110 so that more of the second passivation layer 120 is etched than the first passivation layer 110 in a given time, forming the contact hole 140 having a regular trapezoidal cross section.

Figure 3:
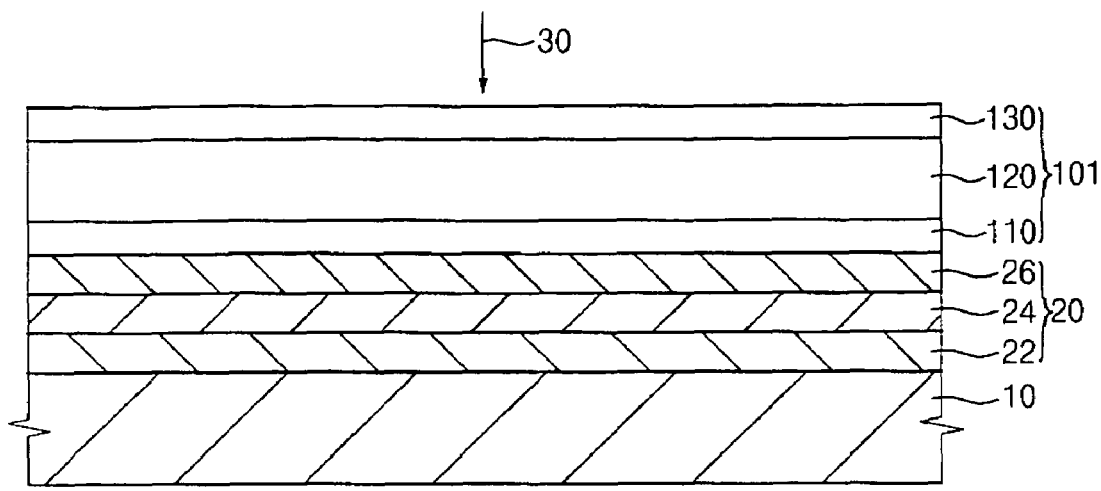
FIG. 3 is a cross-sectional view showing a passivation layer assembly on a substrate in accordance with another exemplary embodiment of the present invention.
Figure 4:
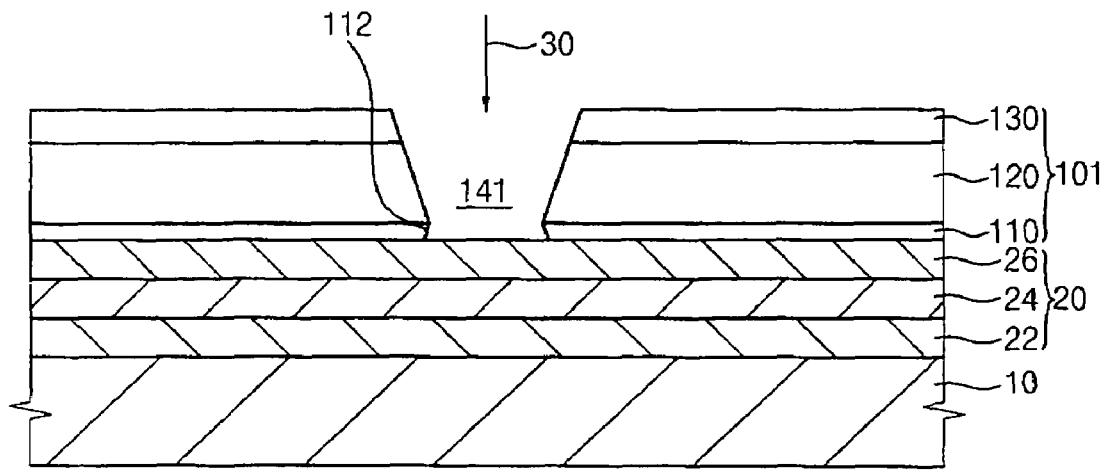
FIG. 4 is a cross-sectional view showing a contact hole formed in the passivation layer assembly shown in FIG. 3.

FIG. 3 is a cross-sectional view showing a passivation layer assembly on a substrate in accordance with another exemplary embodiment of the present invention. FIG. 4 is a cross-sectional view showing a contact hole formed in the passivation layer assembly shown in FIG. 3.

Referring to FIGS. 3 and 4, the passivation layer assembly 101 is formed on a thin film assembly 20 to protect the thin film assembly 20. The thin film assembly 20 is formed on a substrate 10.

The thin film assembly 20 includes a first thin film 22, a second thin film 24 and a third thin film 26.

The first, second and third thin films 22, 24 and 26 may contain a metal. In this exemplary embodiment, the first, second and third thin films 22, 24 and 26 contain molybdenum (Mo), aluminum (Al) and molybdenum (Mo), respectively. The first, second and third thin films 22, 24 and 26 may contain chromium (Cr), aluminum (Al) and chromium (Cr), respectively.

The passivation layer assembly 101 includes a first passivation layer 110, a second passivation layer 120 and a third passivation layer 130.

The first passivation layer 110 is on the thin film assembly 20, and makes contact with the thin film assembly 20 to protect the thin film assembly 20 from impurities in the environment. In this exemplary embodiment, the first passivation layer 110 has a first etching rate with respect to an etching agent 30.

The second passivation layer 120 is on the first passivation layer 110 to protect the thin film assembly 20. In this exemplary embodiment, the second passivation layer 120 has a second etching rate that is lower than that of the first etching rate with respect to the etching agent 30, and has greater thickness than the first passivation layer 110.

The third passivation layer 130 is on the second passivation layer 120 to protect the thin film assembly 20. In this exemplary embodiment, the third passivation layer 130 has the first etching rate with respect to the etching agent 30, and is thinner than the first passivation layer 110.

The passivation layer assembly 101 is etched by the etching agent 30 to form a contact hole 141 through which the thin film assembly 101 is partially exposed.

The second etching rate of the second passivation layer 120 is lower than the first etching rate of the first and third passivation layers 110 and 130 so that less of the second passivation layer 120 is etched per given time than the first and third passivation layers 110 and 130. Therefore, the contact hole 141 has a substantially trapezoidal cross-section except at the first passivation layer 110. When the first passivation layer 110 is thinner than the third passivation layer 130, the wider portion of the contact hole 141 extending through the first passivation layer 110 is negligible so that the contact hole 141 has the substantially trapezoidal cross-section.

The upper portion of the contact hole 141 has a greater width than the lower portion of the contact hole 141, due to the different etching rates and the different lengths of time each layer is exposed to the etchant.

According to this exemplary embodiment, the second passivation layer 120 has lower etching rate than the first and third passivation layers 110 and 130 so that the second passivation layer 120 is etched less than the first and third passivation layers 110 and 130. The contact hole 141 has the regular cross-section of two trapezoids positioned adjacent to each other.

Figure 5:
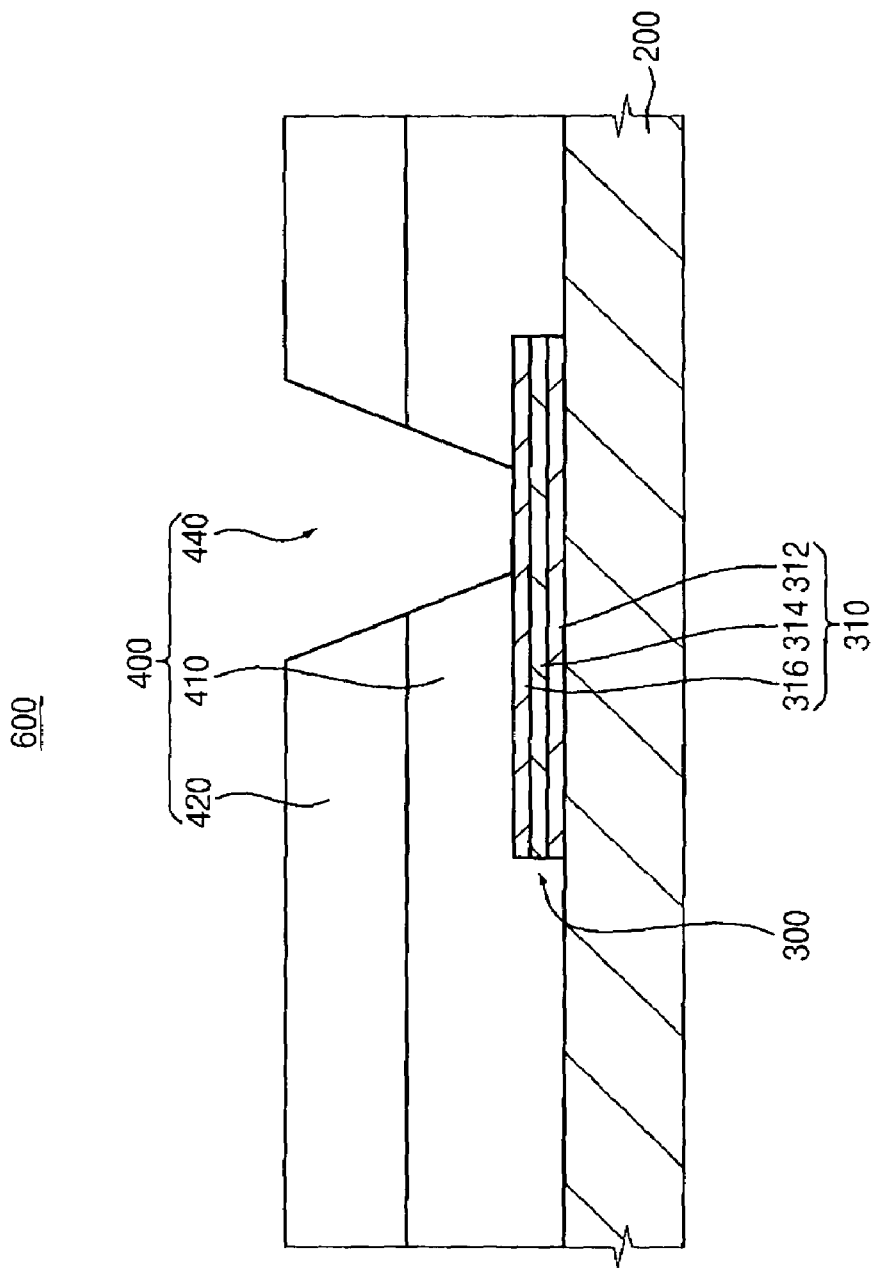
FIG. 5 is a cross-sectional view showing a display substrate in accordance with an exemplary embodiment of the present invention.

FIG. 5 is a cross-sectional view showing a display substrate in accordance with an exemplary embodiment of the present invention.

Referring to FIG. 5, the display substrate 600 includes a substrate 200, a thin film transistor (TFT) 300 and a passivation layer assembly 400.

The substrate 200 has a plate shape and contains a transparent material.

The TFT 300 is on the substrate 200. Alternatively, a plurality of TFTs 300 may be on the substrate 200, and arranged in a matrix shape. The TFT 300 includes a drain electrode 310, a source electrode (not shown) and a gate electrode (not shown). In this exemplary embodiment, each of the drain electrode 310 and the source electrode (not shown) includes a first thin film 312, a second thin film 314 and a third thin film 316.

The first, second and third thin films 312, 314 and 316 may contain a metal. In this exemplary embodiment, the first, second and third thin films 312, 314 and 316 contain molybdenum (Mo), aluminum (Al) and molybdenum (Mo), respectively. The first, second, and third thin films 312, 314 and 316 may contain chromium (Cr), aluminum (Al) and chromium (Cr), respectively.

The passivation layer assembly 400 includes a first passivation layer 410 and a second passivation layer 420, and covers the TFT 300 to protect the TFT 300.

The first passivation layer 410 is on the TFT 300 and contacts the TFT 300 to protect the TFT 300. In this exemplary embodiment, the first passivation layer 410 has a first etching rate with respect to an etching agent.

The second passivation layer 420 is on the first passivation layer 410 and also protects the TFT 300. In this exemplary embodiment, the second passivation layer 420 has a second etching rate that is higher than the first etching rate with respect to the etching agent.

The passivation layer assembly 400 is etched by the etching agent to form a contact hole 440 through which the drain electrode 310 of the TFT 300 is partially exposed.

According to this exemplary embodiment, the second etching rate of the second passivation layer 420 is higher than the first etching rate of the first passivation layer 410 so that the average diameter of the contact hole 440 is larger in the second passivation layer 420 than in the first passivation layer 410. Therefore, the contact hole 440 has a regular cross-section such as a trapezoidal cross-section.

Figure 6:
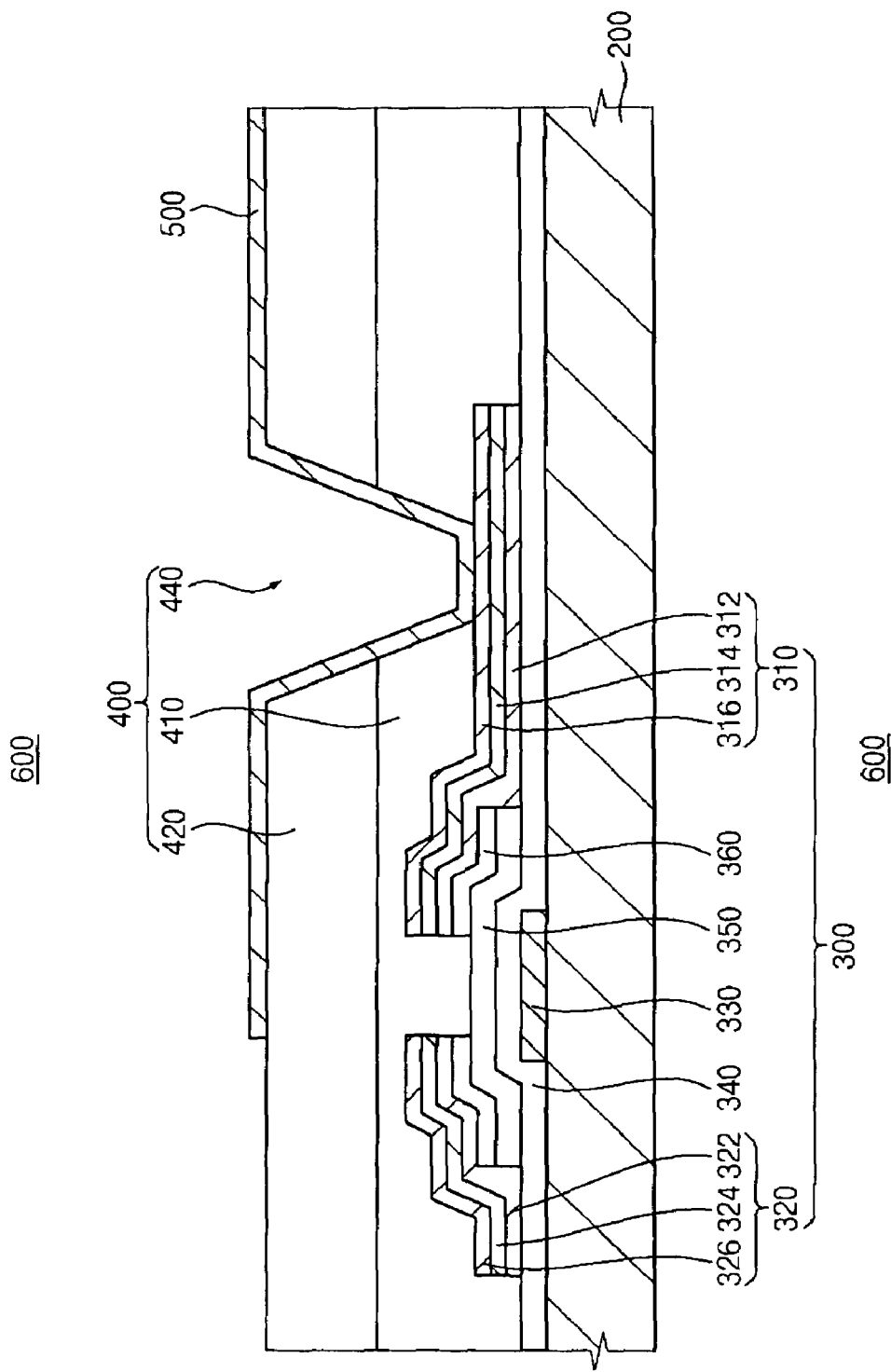
FIG. 6 is a cross-sectional view showing a display substrate in accordance with another exemplary embodiment of the present invention.

FIG. 6 is a cross-sectional view showing a display substrate in accordance with another exemplary embodiment of the present invention.

Referring to FIG. 6, the display substrate 600 includes a substrate 200, a TFT 300, a passivation layer assembly 400 and a pixel electrode 500.

The substrate 200 has a plate shape, and contains a transparent material.

The TFT 300 is on the substrate 200. Alternatively, a plurality of TFTs 300 may be on the substrate 200, and arranged in a matrix shape. The TFT 300 includes a drain electrode 310, a source electrode 320 and a gate electrode 330.

In particular, the gate electrode 330 is on the substrate 200, and a gate insulating layer 340 is on the substrate 200 having the gate electrode 330. A channel layer 350 is on the gate insulating layer 340 corresponding to the gate electrode 330. The drain electrode 310 and the source electrode 320 are on the channel layer 350. The drain electrode 310 is spaced apart from the source electrode 320. An ohmic contact layer 360 is between the channel layer 350 and each of the drain and source electrodes 310 and 320. The ohmic contact layer 360 may be an N+ amorphous silicon layer that is implanted by N+ impurities.

The drain electrode 310 includes a first drain thin film 312, a second drain thin film 314 and a third drain thin film 316. The source electrode 320 includes a first source thin film 322, a second source thin film 324 and a third source thin film 326.

The first, second and third drain thin films 312, 314 and 316 and the first, second and third source thin films 322, 324 and 326 may contain a metal. In this exemplary embodiment, the first, second and third drain thin films 312, 314 and 316 contain molybdenum (Mo), aluminum (Al) and molybdenum (Mo), respectively, and the first, second and third source thin films 322, 324 and 326 contain molybdenum (Mo), aluminum (Al) and molybdenum (Mo), respectively. Alternatively, the first, second and third drain thin films 312, 314 and 316 may contain chromium (Cr), aluminum (Al) and chromium (Cr), respectively, and the first, second and third source thin films 322, 324 and 326 may contain chromium (Cr), aluminum (Al) and chromium (Cr), respectively.

The passivation layer assembly 400 includes a first passivation layer 410 and a second passivation layer 420, and covers the TFT 300 to protect the TFT 300.

The first passivation layer 410 is on the TFT 300, and makes contact with the TFT 300 to protect the TFT 300. In this exemplary embodiment, the first passivation layer 410 has a first etching rate with respect to an etching agent.

The second passivation layer 420 is on the first passivation layer 410 to protect the TFT 300. In this exemplary embodiment, the second passivation layer 420 has a second etching rate that is higher than the first etching rate with respect to the etching agent.

The passivation layer assembly 400 is etched by the etching agent to form a contact hole 440 through which the drain electrode 310 of the TFT 300 is partially exposed.

In this exemplary embodiment, the second etching rate of the second passivation layer 420 is higher than the first etching rate of the first passivation layer 410 so that the average diameter of the contact hole 440 is larger in the second passivation layer 420 than in the first passivation layer 410. Therefore, the contact hole 440 has a regular trapezoidal cross-section.

The pixel electrode 500 is on the passivation layer assembly 400, and electrically connected to the drain electrode 310 through the contact hole 440 in the passivation layer assembly 400.

In this exemplary embodiment, the pixel electrode 500 contains one or more of indium tin oxide (ITO), indium zinc oxide (IZO), amorphous indium tin oxide a-ITO, etc.

FIG. 7 is a cross-sectional view showing a display substrate in accordance with another exemplary embodiment of the present invention.

Referring to FIG. 7, the display substrate 600 includes a substrate 200, a thin film transistor (TFT) 300 and a passivation layer assembly 400.

The substrate 200 has a plate shape, and contains a transparent material.

The TFT 300 is on the substrate 200. Alternatively, a plurality of TFTs 300 may be on the substrate 200, and arranged in a matrix shape. The TFT 300 includes a drain electrode 310, a source electrode (not shown) and a gate electrode (not shown). In this exemplary embodiment, each of the drain electrode 310 and the source electrode (not shown) includes a first thin film 312, a second thin film 314 and a third thin film 316.

The first, second and third thin films 312, 314 and 316 may contain a metal. In this exemplary embodiment, the first, second and third thin films 312, 314 and 316 contain molybdenum (Mo), aluminum (Al) and molybdenum (Mo), respectively. The first, second and third thin films 312, 314 and 316 may contain chromium (Cr), aluminum (Al) and chromium (Cr), respectively.

The passivation layer assembly 400 includes a first passivation layer 410, a second passivation layer 420 and a third passivation layer 430, and covers the TFT 300 to protect the TFT 300.

The first passivation layer 410 is on the TFT 300, and contacts the TFT 300 to protect the TFT 300 from impurities in the environment. In this exemplary embodiment, the first passivation layer 410 has a first etching rate with respect to an etching agent.

The second passivation layer 420 is on the first passivation layer 410 to protect the TFT 300. In this exemplary embodiment, the second passivation layer 420 has a second etching rate that is lower than the first etching rate with respect to the etching agent, and has greater thickness than the first passivation layer 410.

The third passivation layer 430 is on the second passivation layer 420 to protect the TFT. In this exemplary embodiment, the third passivation layer 430 has the first etching rate with respect to the etching agent, and is thicker than the first passivation layer 410.

The passivation layer assembly 400 is etched by the etching agent to form a contact hole 441 through which the thin film assembly 400 is partially exposed.

According to this exemplary embodiment, the second etching rate of the second passivation layer 420 is lower than the first etching rate of the first and third passivation layers 410 and 430 so that the diameter of the contact hole 441 is smaller at the second passivation layer 420 than at the first and third passivation layers 410 and 430. Therefore, the cross-section of the contact hole 441 has a shape that resembles two substantially trapezoidal shapes placed adjacent to each other. When the first passivation layer 410 is thinner than the third passivation layer 430, the wider portion of the contact hole 441 extending through the third passivation layer 430 is negligible so that the contact hole 441 has the substantially trapezoidal cross-section.

According to the present invention, the second passivation layer has higher etching rate than the first passivation layer so that the contact hole has the regular cross-section. Therefore, the TFT is securely connected to the pixel electrode to prevent a malfunction of the LCD device.

This invention has been described with reference to the exemplary embodiments. It is evident, however, that many alternative modifications and variations will be apparent to those skilled in the art in light of the foregoing description. Accordingly, the present invention embraces all such alternative modifications and variations as fall within the spirit and scope of the appended claims.

What is claimed is:

1. A passivation layer assembly to protect a thin film assembly formed on a substrate, the passivation layer assembly comprising:
   a first silicon nitride layer;
   a second silicon nitride layer; and
   a third silicon nitride layer,
   wherein each of the silicon nitride layers have a different nitrogen composition;
   wherein a contact hole through which the thin film assembly is exposed is formed at the first, second, and third silicon nitride layers; and
   wherein an upper portion and a lower portion of the contact hole has a width greater than the width of a middle portion of the contact hole.

2. The passivation layer assembly of claim 1, wherein the thin film assembly is between the substrate and the passivation layer assembly, and the thin film assembly comprises a first molybdenum thin film, an aluminum thin film on the first molybdenum thin film and a second molybdenum thin film on the aluminum thin film.

3. The passivation layer assembly of claim 1, wherein the thin film assembly is between the substrate and the passivation layer assembly, and the thin film assembly comprises a first chromium thin film, an aluminum thin film on the first chromium thin film and a second chromium thin film on the aluminum thin film.

4. The passivation layer assembly of claim 1, wherein the third silicon nitride layer is interposed between the thin film assembly and the second silicon nitride layer, and the second silicon nitride layer is interposed between the third silicon nitride layer and the first silicon nitride layer.

5. The passivation layer assembly of claim 4, wherein the third silicon nitride layer is thinner than the second silicon nitride layer, and the second silicon nitride layer is thicker than the first silicon nitride layer.

6. A display substrate comprising:
   a substrate;
   a thin film transistor on the substrate, the thin film transistor including a source electrode, a drain electrode and a gate electrode each containing a metal; and
   a passivation layer assembly formed on the substrate, the passivation layer having a contact hole through which the drain electrode is partially exposed, the passivation layer assembly including:
   a first silicon nitride layer
   a second silicon nitride layer; and
   a third silicon nitride layer,
   wherein each of the silicon nitride layers have a different nitrogen composition:
   wherein a contact hole through which the drain electrode is exposed is formed at the first, second, and third silicon nitride layers: and
   wherein an upper portion and a lower portion of the contact hole has a width greater than the width of a middle portion of the contact hole.

7. The display substrate of claim 6, wherein the source and drain electrodes are between the substrate and the passivation layer assembly, and each of the source electrode and the drain electrode comprises a first molybdenum thin film, an aluminum thin film on the first molybdenum thin film and a second molybdenum thin film on the aluminum thin film.

8. The display substrate of claim 6, wherein the source electrode and the drain electrode are between the substrate and the passivation layer assembly, and each of the source electrode and the drain electrodes comprises a first chromium thin film, an aluminum thin film on the first chromium thin film, and a second chromium thin film on the aluminum thin film.

9. The display substrate of claim 6, the third silicon nitride layer is interposed between the source and the drain electrodes and the first silicon nitride layer.

10. The display substrate of claim 9, wherein the third silicon nitride layer is thinner than the second silicon nitride layer, and the second silicon nitride layer is thicker than the first silicon nitride layer.

* * * * *